(12) United States Patent
Riviere

(10) Patent No.: US 10,903,388 B2
(45) Date of Patent: Jan. 26, 2021

(54) ELECTRONIC DEVICE COMPRISING ELECTRONIC CHIPS

(71) Applicant: STMicroelectronics (Grenoble 2) SAS, Grenoble (FR)

(72) Inventor: Jean-Michel Riviere, Froges (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 14 days.

(21) Appl. No.: 16/377,379

(22) Filed: Apr. 8, 2019

(65) Prior Publication Data

US 2019/0319160 A1 Oct. 17, 2019

(30) Foreign Application Priority Data

Apr. 11, 2018 (FR) .................................. 18 53152

(51) Int. Cl.

| H01L 31/167 | (2006.01) |
|---|---|
| H01L 31/02 | (2006.01) |
| H01L 23/00 | (2006.01) |
| H01L 31/0232 | (2014.01) |
| G01V 8/20 | (2006.01) |

(Continued)

(52) U.S. Cl.
CPC .............. *H01L 31/167* (2013.01); *G01V 8/20* (2013.01); *H01L 24/48* (2013.01); *H01L 25/0652* (2013.01); *H01L 25/167* (2013.01); *H01L 31/0203* (2013.01); *H01L 31/02005* (2013.01);

(Continued)

(58) Field of Classification Search
CPC .............. H01L 25/0652; H01L 25/0657; H01L 25/071; H01L 25/074; H01L 25/0756; H01L 25/162; H01L 25/167; H01L 31/02325; H01L 31/125; H01L 31/167; H01L 31/173
See application file for complete search history.

(56) References Cited

U.S. PATENT DOCUMENTS

2003/0165051 A1* 9/2003 Kledzik ................... H05K 7/12
361/760
2011/0002582 A1* 1/2011 Okamoto ................ H01L 24/16
385/14

(Continued)

FOREIGN PATENT DOCUMENTS

| FR | 3012670 A1 | 5/2015 |
|---|---|---|
| FR | 3055509 A1 | 3/2018 |

OTHER PUBLICATIONS

INPI Search Report and Written Opinion for FR 1853152 dated Nov. 28, 2018 (8 pages).

*Primary Examiner* — Stephen W Smoot
(74) *Attorney, Agent, or Firm* — Crowe & Dunlevy

(57) ABSTRACT

A main carrier wafer includes a first integrated network of electronic connections between front and back faces. A first electronic chip is mounted to the front face of the main carrier wafer and connected to the network of electronic connections of the main carrier wafer. A secondary carrier wafer includes a platform that extends over the first chip and a base the protrudes backwards with respect to the platform to a back end face facing the main wafer. A second integrated network of electronic connections is provided within the secondary carrier wafer. A second electronic chip is mounted on top of the platform and connected to the second integrated network. The second integrated network is further connected to the main carrier wafer at the back end face.

22 Claims, 3 Drawing Sheets

(51) Int. Cl.
*H01L 31/0203* (2014.01)
*H01L 25/16* (2006.01)
*H01L 31/173* (2006.01)
*H01L 25/065* (2006.01)

(52) U.S. Cl.
CPC ...... *H01L 31/02325* (2013.01); *H01L 31/173* (2013.01); *H01L 2224/48227* (2013.01)

(56) References Cited

U.S. PATENT DOCUMENTS

| | | | |
|---|---|---|---|
| 2014/0327129 A1 | 11/2014 | Cho et al. | |
| 2015/0028474 A1* | 1/2015 | Jang | H01L 23/49827 257/737 |
| 2015/0115424 A1* | 4/2015 | Riviere | H01L 23/49816 257/675 |
| 2018/0182745 A1* | 6/2018 | Ikeda | H01L 23/053 |

* cited by examiner

ELECTRONIC DEVICE COMPRISING ELECTRONIC CHIPS

PRIORITY CLAIM

This application claims the priority benefit of French Application for Patent No. 1853152, filed on Apr. 11, 2018, the content of which is hereby incorporated by reference in its entirety to the maximum extent allowable by law.

TECHNICAL FIELD

The present invention relates to the field of microelectronics and more particularly to the field of electronic devices including electronic chips.

SUMMARY

In an embodiment, an electronic device comprises: a main carrier wafer having a back face and a front face and provided with an integrated network of electronic connections, from one face to the other; a first electronic chip mounted on top of the front face of the main carrier wafer and connected to the network of electronic connections of the main carrier wafer; a secondary carrier wafer comprising a platform extending over the first chip and having a back face and a front face and comprising a base protruding backwards with respect to the platform and extending laterally to the first chip in the direction of the main carrier wafer so as to have a back end face facing the front face of the main wafer; and a second electronic chip mounted on top of a front face of the platform.

Advantageously, the secondary carrier wafer is provided with an integrated network of electronic connections comprising at least one front pad of the front face of the platform, connected to the second chip, and at least one back pad of the back end face of said base, connected to the network of electrical connections of the main carrier wafer.

Thus, a compact electronic device may be obtained, in which the second chip is linked directly to the network of electrical connections of the main carrier wafer via the network of electrical connections of the secondary carrier wafer.

The platform of the secondary carrier wafer may extend at a distance from the first chip.

A supporting spacer may be interposed between the first chip and the platform of the secondary carrier wafer.

The secondary carrier wafer may comprise a supporting base protruding backwards with respect to the platform and bearing against the top of the first chip and/or of the main carrier wafer.

The front face of the first chip may be provided with at least one light sensor.

The front face of the second chip may be provided with at least one light sensor.

The device may comprise a third electronic chip mounted on top of the front face of the main carrier wafer, a front face of this third chip being is provided with a light emitter.

According to one variant embodiment, the device may comprise a cover mounted on the main carrier wafer and defining a chamber in which the secondary carrier wafer and the second chip are located.

According to another variant embodiment, the device may comprise a cover mounted on top of the main carrier wafer and having an interior partition defining two chambers, the secondary carrier wafer and the second chip being located in one of the chambers and the first chip passing through said interior partition.

A front wall of said cover may have at least one opening provided with an optical element allowing light to pass through.

BRIEF DESCRIPTION OF THE DRAWINGS

An electronic device will now be described by way of non-limiting exemplary embodiment, illustrated by the drawing, in which.

DETAILED DESCRIPTION

Figure 1:
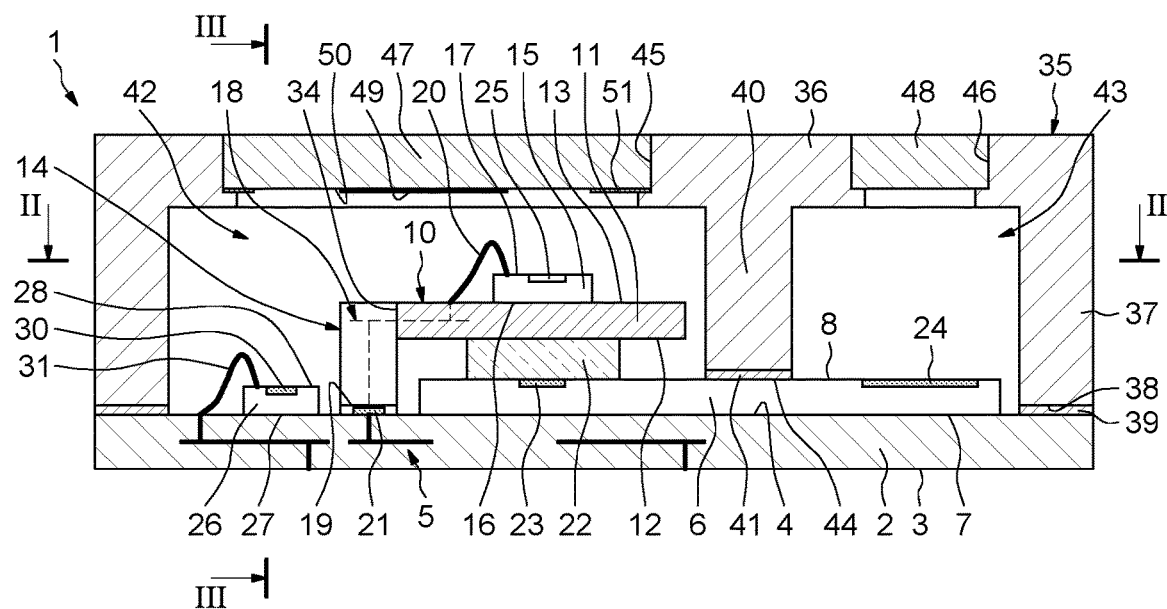
FIG. 1 shows a longitudinal section of the electronic device.
Figure 2:
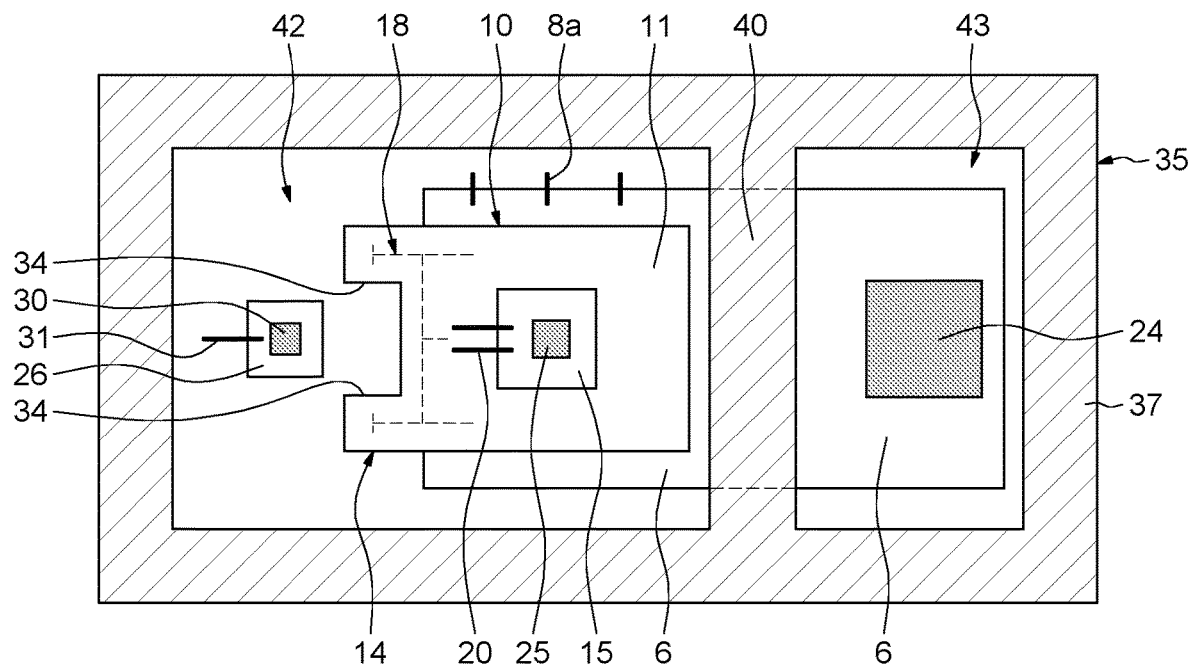
FIG. 2 shows a top view of the electronic device, along II-II marked in FIG. 1, the cover being in section.
Figure 3:
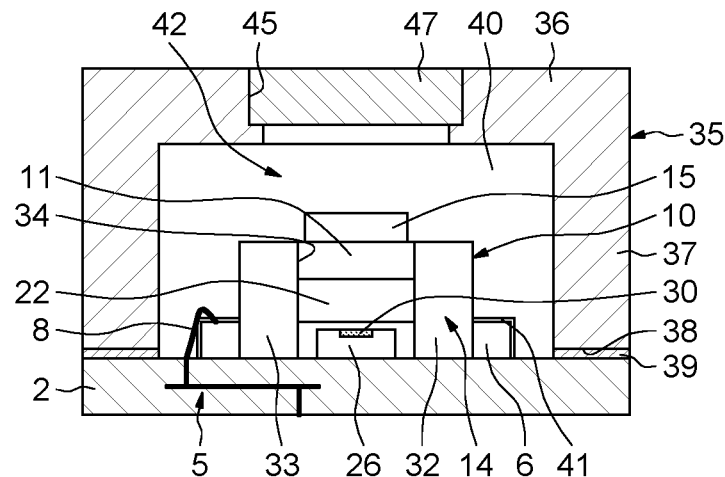
FIG. 3 shows a cross section of the electronic device, along marked in FIG. 1.
Figure 4:
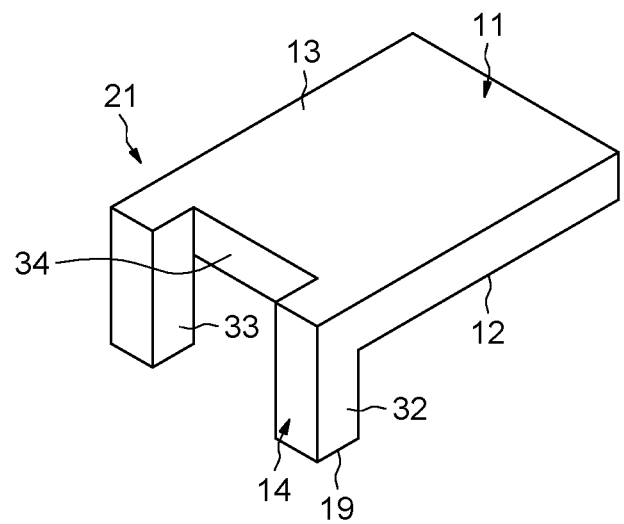
FIG. 4 shows a perspective view of a secondary carrier wafer of the electronic device.

An electronic device 1, illustrated in FIGS. 1 to 4, comprises a main carrier wafer 2 made of a dielectric material, for example having a rectangular outline, which has a back face 3 and a front face 4 and which is provided with an integrated network 5 of electrical connections that electrically connect front pads on the front face to back pads on the back face.

The electronic device 1 comprises a first electronic integrated circuit chip 6, for example having a rectangular outline, which has a back face 7 and a front face 8 and which is mounted above the front face 4 of the main carrier wafer 2 via a layer of adhesive interposed between the front face 4 of the main carrier wafer 2 and the back face 7 of the first chip 6.

The first chip 6 is connected to the network of electrical connections 5 by electrical connection wires 8a linking front pads of the first chip 6 to front pads of the main carrier wafer 2. According to one variant embodiment, the first chip 6 could be connected to the network of electrical connections 5 by electrical connection elements between pads of the front face 4 of the main carrier wafer 2 and pads of the back face 7 of the first chip 6.

The electronic device 1 comprises a secondary carrier wafer 10, made of a dielectric material, which comprises a platform 11 located above and a distance away from the first chip 6 and which has a back face 12 and a front face 13. The platform 11, for example having a rectangular outline, extends partly over and at a distance from the first chip 6 and partly laterally beyond the first chip 6.

The secondary carrier wafer 10 comprises a base 14 which projects, with respect to the back face 12 of the platform 11, laterally to the first chip 6 and in the direction of the front face 8 of the main carrier wafer 2.

The electronic device 1 comprises a second electronic integrated circuit chip 15 which has a back face 16 and a front face 17 and which is mounted above the front face 13 of the platform 11 via a layer of adhesive interposed between the front face 13 of the platform 11 and the back face 16 of the second chip 15.

The secondary carrier wafer 10 is provided with an integrated network 18 of electrical connections which comprises back pads of the back end face 19 of the base 14, facing the front face 8 of the main carrier wafer 2, and front pads of the front face 13 of the platform 11. For this, the integrated network of electrical connections 18 comprises, for example, integrated tracks of the platform 11 and integrated vias of the base 14.

The second chip 15 is connected to the network of electrical connections 18 by electrical connection wires 20 linking front pads of the second chip 15 to front pads of the platform 11. According to one variant embodiment, the second chip 13 could be connected to the network of electrical connections 18 by electrical connection elements between pads of the front face 13 of the platform 11 and pads of the back face 16 of the second chip 13.

Back pads of the back end face 19 of the base 14 are connected to front pads of the network of electrical connections 5 of the main carrier wafer 2 by local pointlike electrical junctions 21 formed by spots of an electrically conductive adhesive or solder bumps.

Thus, the second chip 15 is directly connected to the network of electrical connections 5 of the main carrier wafer 2 via the network of electrical connections 18 of the secondary carrier wafer 10. Thus, potential electrical losses are decreased.

The local pointlike electrical junctions 21 allow the secondary carrier wafer 10 to be attached above the main carrier wafer 2. However, dielectric adhesive may further be interposed between the front face 8 of the main carrier wafer 2 and the back face 19 of the base 14 of the secondary carrier wafer 10.

The electronic device 1 further comprises a supporting spacer 22, for example in the form of a local plate, located between the main carrier wafer 2 and the platform 11 of the secondary carrier wafer 10, with a bonding adhesive interposed between them.

The secondary carrier wafer 10 may be fabricated in the following manner.

An initial one-piece wafer is provided having parallel opposite faces, the thickness of which corresponds to the distance between the front face 13 of the platform 11 and the back face 19 of the base 14. This initial wafer is provided with the network of electrical connections 18.

The thickness of this initial wafer is locally decreased by machining so as to obtain the platform 11 and to leave the base 14. Of course, the removed portion of the initial wafer does not include any portion of the network of electrical connections 18.

According to one exemplary embodiment, the electronic device 1 comprises the following arrangements.

A longitudinal direction and a transverse direction are considered.

The first chip 6 comprises two light sensors 23 and 24, which are longitudinally spaced apart.

The platform 11 at least partly covers, at a distance, the portion of the chip 6 having the light sensor 23 and does not cover the portion of the chip 6 having the light sensor 24.

The second chip 13 has, in its front face 17, a light sensor 25.

The electronic device 1 further comprises a third electronic integrated circuit chip 26 which has a back face 27 and a front face 28 and which is mounted on the front face 8 of the main carrier wafer 2, on the side of and a distance away from the portion of the first chip 6 having the light sensor 23.

The third chip 26 has, in its front face 28, a light emitter 30 and is connected to the network of electrical connections 5 of the main carrier wafer 2, for example by a junction between a back pad of the back face 27 of the third chip 26 and a front pad of the main carrier wafer 2 and by an electrical wire 31 linking a front pad of the third chip 26 and a front pad of the main carrier wafer 2. According to one variant embodiment, the third chip 26 could be connected to the network of electrical connections 5 by electrical connection elements between pads of the front face 4 of the main carrier wafer 2 and pads of the back face 27 of the third chip 26.

Advantageously, the light sensors 23 and 24 and the light emitter are longitudinally aligned and the light sensor 25 of the second chip 15 is located approximately above the light sensor 23 of the first chip 6.

According to one particular arrangement, the supporting spacer 22 covers the light sensor 23 of the first chip 6 and is made of a transparent material. The adhesive between the first chip 6 and the supporting spacer 22 is transparent.

The base 14 comprises two feet 32 and 33 which are transversely spaced apart and located on the side of the third chip 26 with respect to the first chip 6 and on either side of the third chip 26.

On the side of the third chip 26, the platform 11 of the secondary carrier wafer 10 has a notch 34.

The electronic device 1 comprises a cover 35 that comprises a front or frontal wall 36 and a peripheral wall 37 which extends backwards from the front wall 36 and which has a back end face 38 located on top of a peripheral zone of the front face 4 of the main carrier wafer 2.

The cover 35 is attached to the main carrier wafer 2 via a bead of adhesive 39 interposed between the front face 4 of the main carrier wafer 2 and the back end face 38 of the peripheral wall 37.

The cover 35 comprises a transverse interior partition 40 which projects backwards from the front wall 36 and joins the longitudinal sides of the peripheral wall 37.

The interior partition 40 has a back notch 41 through which the first chip 6 passes and defines two chambers 42 and 43 above the main carrier wafer 2, such that the light sensor 23 of the first chip 6, the secondary carrier wafer 10, the second chip 15, the supporting spacer 22 and the third chip 26 are located in the chamber 42 and that the light sensor 24 of the first chip 6 is located in the chamber 43.

A bead of adhesive 44 is interposed between the interior partition 40 and the first chip 6, in the notch 41, and between the interior partition 40 and the main carrier wafer 2, on either side of the first chip 6.

The frontal wall 36 of the cover 35 has through-openings 45 and 46 which are located facing the chambers 42 and 43 and which are provided with optical elements 47 and 48 through which light may pass, which optical elements take the shape of plates, for example. The optical elements 47 and 48 may bear against interior shoulders of the openings 45 and 46 and be bonded to the front wall 36 of the cover 35.

The back face of the optical element 47 is provided with an opaque layer 49 provided with an opening 50 located above the light emitter 30 of the third chip 26 and with an opening 51 located above the light sensor of the second chip 15.

The optical element 48 is located above the light sensor 24 of the first chip 6.

According to one variant embodiment, the optical element 47 could be replaced with two optical elements mounted in specific through-openings of the front wall 36, which optical elements are located facing the light emitter 30 and the light sensor 25.

The electronic device 1 may operate in the following way.

The light emitter 30 of the third chip 26 emits light, for example infrared, radiation outwards through opening 50 of the opaque layer 49 and the optical element 47. Because of the presence of the notch 34 of the secondary carrier wafer 10, the emitted light may directly reach the optical element 47. The emitted light radiation, present in the chamber 42, is detected by the light sensor 23 of the first chip 6.

The light sensor 24 of the first chip 6 detects external light radiation through the optical element 48.

The light sensor 25 of the second chip 15 detects external light radiation through the optical element 47 and the opening 51 of the opaque layer 49. The second chip 15 may be made insensitive to the radiation emitted by the third chip 26 by means of filtering or by sequencing the operation of the light sensor 25 and the light emitter 30.

The electronic device 1 may constitute a means for detecting the proximity of a body by processing the signals arising from the light sensors 23, 24 and 25.

By virtue of the various described arrangements, the electronic device 1 is particularly compact.

Figure 5:
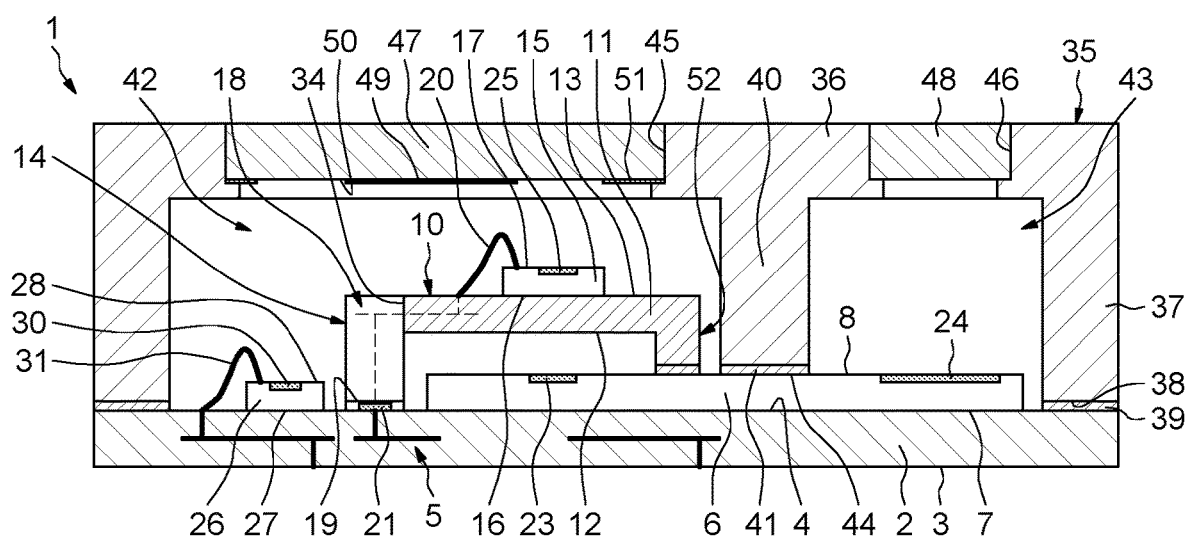
FIG. 5 shows a longitudinal section of a variant embodiment of the electronic device.

According to one variant embodiment illustrated in FIG. 5, the supporting spacer 22 is omitted and the platform 11 of the secondary carrier wafer 10 comprises a supporting base 52 protruding backwards with respect to the platform 11 and bearing against the top of the first chip 6 and/or of the main carrier wafer 2. The base is located longitudinally opposite the base 14, on the side of the interior partition 40.

The supporting base 52 may comprise at least one foot attached to the top of the front face 8 of the first chip 6 by a bead of adhesive and/or at least one foot extending laterally to the first chip 6 and attached to the top of the front face 4 of the main carrier wafer 2 by a bead of adhesive.

The invention claimed is:

1. An electronic device, comprising:
 a main carrier wafer having a back face and a front face and provided with an integrated network of electronic connections extending between the front face and the back face;
 a first electronic chip mounted on top of the front face of the main carrier wafer and connected to the network of electronic connections of the main carrier wafer;
 a secondary carrier wafer comprising a platform extending over the first electronic chip and having a back face and a front face and comprising a base protruding backwards with respect to the platform, wherein the base extends laterally with respect to the first chip and backward in the direction of the main carrier wafer so as to have a back end face facing the front face of the main carrier wafer; and
 a second electronic chip mounted on top of the front face of the platform;
 wherein the secondary carrier wafer is provided with an integrated network of electronic connections comprising at least one front pad at the front face of the platform which is connected to the second electronic chip, and at least one back pad at the back end face of said base which is connected to the network of electrical connections of the main carrier wafer; and
 a supporting spacer interposed between the first electronic chip and the platform of the secondary carrier wafer.

2. The device according to claim 1, wherein the platform of the secondary carrier wafer is separated from the first electronic chip by a distance.

3. The device according to claim 1, wherein the front face of the first electronic chip is provided with at least one light sensor.

4. The device according to claim 1, wherein the front face of the second electronic chip is provided with at least one light sensor.

5. The device according to claim 1, further comprising a third electronic chip mounted on top of the front face of the main carrier wafer and wherein a front face of the third electronic chip is provided with a light emitter.

6. An electronic device, comprising:
 a main carrier wafer having a back face and a front face and provided with an integrated network of electronic connections extending between the front face and the back face;
 a first electronic chip mounted on top of the front face of the main carrier wafer and connected to the network of electronic connections of the main carrier wafer;
 a secondary carrier wafer comprising a platform extending over the first electronic chip and having a back face and a front face and comprising a base protruding backwards with respect to the platform, wherein the base extends laterally with respect to the first chip and backward in the direction of the main carrier wafer so as to have a back end face facing the front face of the main carrier wafer;
 a second electronic chip mounted on top of the front face of the platform;
 wherein the secondary carrier wafer is provided with an integrated network of electronic connections comprising at least one front pad at the front face of the platform which is connected to the second electronic chip, and at least one back pad at the back end face of said base which is connected to the network of electrical connections of the main carrier wafer; and
 a cover mounted on the main carrier wafer and defining a chamber in which the secondary carrier wafer and the second electronic chip are located.

7. The device according to claim 6, wherein a front wall of said cover has at least one opening provided with an optical element allowing light to pass through.

8. The device according to claim 6, wherein the front face of the first electronic chip is provided with at least one light sensor.

9. The device according to claim 6, wherein the front face of the second electronic chip is provided with at least one light sensor.

10. The device according to claim 6, further comprising a third electronic chip mounted on top of the front face of the main carrier wafer and wherein a front face of the third electronic chip is provided with a light emitter.

11. The device according to claim 6, wherein the platform of the secondary carrier wafer is separated from the first electronic chip by a distance.

12. An electronic device, comprising:
 a main carrier wafer having a back face and a front face and provided with an integrated network of electronic connections extending between the front face and the back face;
 a first electronic chip mounted on top of the front face of the main carrier wafer and connected to the network of electronic connections of the main carrier wafer;
 a secondary carrier wafer comprising a platform extending over the first electronic chip and having a back face and a front face and comprising a base protruding backwards with respect to the platform, wherein the base extends laterally with respect to the first chip and backward in the direction of the main carrier wafer so as to have a back end face facing the front face of the main carrier wafer;
 a second electronic chip mounted on top of the front face of the platform;

wherein the secondary carrier wafer is provided with an integrated network of electronic connections comprising at least one front pad at the front face of the platform which is connected to the second electronic chip, and at least one back pad at the back end face of said base which is connected to the network of electrical connections of the main carrier wafer; and a cover mounted on top of the main carrier wafer and having an interior partition defining two chambers, the secondary carrier wafer and the second electronic chip being located in one of the chambers and the first electronic chip passing through said interior partition.

13. The device according to claim 12, wherein a front wall of said cover has at least one opening provided with an optical element allowing light to pass through.

14. The device according to claim 12, wherein the front face of the first electronic chip is provided with at least one light sensor.

15. The device according to claim 12, wherein the front face of the second electronic chip is provided with at least one light sensor.

16. The device according to claim 12, further comprising a third electronic chip mounted on top of the front face of the main carrier wafer and wherein a front face of the third electronic chip is provided with a light emitter.

17. The device according to claim 12, wherein the platform of the secondary carrier wafer is separated from the first electronic chip by a distance.

18. An electronic device, comprising:
a main carrier wafer having a back face and a front face and provided with an integrated network of electronic connections extending between the front face and the back face;
a first electronic chip mounted on top of the front face of the main carrier wafer and connected to the network of electronic connections of the main carrier wafer;
a secondary carrier wafer comprising a platform extending over the first electronic chip and having a back face and a front face and comprising a base protruding backwards with respect to the platform, wherein the base extends laterally with respect to the first chip and backward in the direction of the main carrier wafer so as to have a back end face facing the front face of the main carrier wafer; and
a second electronic chip mounted on top of the front face of the platform;
wherein the secondary carrier wafer is provided with an integrated network of electronic connections comprising at least one front pad at the front face of the platform which is connected to the second electronic chip, and at least one back pad at the back end face of said base which is connected to the network of electrical connections of the main carrier wafer; and
wherein the secondary carrier wafer further comprises a supporting base protruding backwards with respect to the platform and bearing against the top of the first electronic chip.

19. The device according to claim 18, wherein the platform of the secondary carrier wafer is separated from the first electronic chip by a distance.

20. The device according to claim 18, wherein the front face of the first electronic chip is provided with at least one light sensor.

21. The device according to claim 18, wherein the front face of the second electronic chip is provided with at least one light sensor.

22. The device according to claim 18, further comprising a third electronic chip mounted on top of the front face of the main carrier wafer and wherein a front face of the third electronic chip is provided with a light emitter.

\* \* \* \* \*